(12) United States Patent
Bruce et al.

(10) Patent No.: US 6,483,326 B1
(45) Date of Patent: Nov. 19, 2002

(54) LOCALIZED HEATING FOR DEFECT ISOLATION DURING DIE OPERATION

(75) Inventors: Michael R. Bruce, Austin, TX (US); Richard W. Johnson, Cedar Creek, TX (US); Rama R. Goruganthu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/371,754

(22) Filed: Aug. 10, 1999

(51) Int. Cl.[7] .............................................. G01R 31/26
(52) U.S. Cl. ...................... 324/751; 324/765
(58) Field of Search ................................ 324/760, 765, 324/158.1, 750–752, 501; 438/14–18; 251/40–48

(56) References Cited

U.S. PATENT DOCUMENTS

| | | | |
|---|---|---|---|
| 4,698,587 A | | 10/1987 | Burns et al. |
| 5,414,370 A | * | 5/1995 | Hashinaga et al. ......... 324/760 |
| 5,430,305 A | | 7/1995 | Cole, Jr. et al. |
| 5,493,236 A | * | 2/1996 | Ishii et al. .................. 324/752 |
| 5,523,694 A | | 6/1996 | Cole, Jr. |
| 5,708,371 A | * | 1/1998 | Koyama ..................... 324/752 |
| 5,804,980 A | | 9/1998 | Nikawa |
| 5,844,416 A | | 12/1998 | Campbell et al. |
| 5,952,837 A | | 9/1999 | Koyama |
| 6,028,435 A | | 2/2000 | Nikawa |
| 6,066,956 A | | 5/2000 | Nikawa |
| 6,391,664 B1 | | 5/2002 | Goruganthu |

OTHER PUBLICATIONS

Joseph, T., Berry, A., and Bossmann, B., Infrared Laser Microscopy of Structures on Heavily Doped Silicon, ISTFA, Oct., 1992, pp. 1–7.
Cole, Jr., Edward I., Tangyunyong, Paiboon, and Barton, Daniel L., *Backside Localization of Open and Shorted IC Interconnections*, 1998, pp. 129–136 (Month unavailable).
Poate, J. M. and Mayer, James W., editors, *Laser Annealing of Semiconductors*, 1982, pp. 43–47 (Month unavailable).
Infrared Microscopy of Doped Silicon: Zeiss 321IR; ISTFA p.1 (1992) (Month unavailable).
Laser Thermal Effects: Sandia Report "AMD SOM/Laser Thermal Stimulation of Front and Backside Timing Paths" Sep. 4, 1998 Sandia AMD CRADA Team.

* cited by examiner

Primary Examiner—Vinh P. Nguyen

(57) ABSTRACT

According to an example embodiment, a method for testing a semiconductor die is provided. The semiconductor die has circuitry on one side and silicon on an opposite side, and the opposite side may be AR coated. The opposite side is thinned, the die is powered, and a portion of the circuitry is heated to cause a reaction (e.g., a circuit failure or recovery) in a target region. The circuitry is monitored, and the circuit that reacts to the heat is detected and analyzed.

25 Claims, 4 Drawing Sheets

LOCALIZED HEATING FOR DEFECT ISOLATION DURING DIE OPERATION

FIELD OF THE INVENTION

The present device relates generally to semiconductor devices and their fabrication and, more particularly, to semiconductor devices and their manufacture involving defect isolation.

BACKGROUND OF THE INVENTION

The electronics industry continues to rely upon advances in semiconductor technology, including integrated circuits, to realize higher-functioning devices in more compact areas. For many applications, realizing higher-functioning devices requires integrating a large number of electronic devices into a single silicon wafer. In addition, many of the individual devices within the wafer are being manufactured with smaller physical dimensions. As the number of electronic devices per given area of the silicon wafer increases, and as the size of the individual devices decreases, testing processes become more important and more difficult.

Many defects in integrated circuits can recover or fail at higher temperatures. For instance, circuit sites exhibiting temperature sensitive defects, such as charge trapping and ionic contamination, can recover when heated. Traditionally, isolation of defective sites has been attempted by heating the entire device during extensive electrical testing. Such electrical testing, however, does not always work. Moreover, even if a unique node is electrically identified, the physical defective site usually cannot be identified.

Semiconductor technology would benefit from a practical method and apparatus for heat testing integrated circuits for isolation of defective sites.

SUMMARY OF THE INVENTION

The present invention is exemplified in a number of implementations and applications, some of which are summarized below. According to an example embodiment, the present invention is directed to a method for testing a semiconductor die. The semiconductor die has circuitry on one side and silicon on an opposite side. The opposite side is thinned. The die is powered via a power supply, and heat is directed via the opposite side to a portion of the circuitry. The circuitry is monitored, and a circuit that reacts to the heat is detected therein.

According to another example embodiment, the present invention is directed to a system for testing a semiconductor die. The die has circuitry on one side and silicon on an opposite side. The system includes a first means for thinning the opposite side, a second means for directing heat via the opposite side to a portion of the circuitry, and a third means for monitoring the circuitry and detecting therein a circuit that reacts to the heat. The first and second means are optionally implemented using the same tool, e.g., a laser.

According to yet another example embodiment, the present invention is directed toward a system for testing a semiconductor die having circuitry on one side and silicon on an opposite side, wherein the opposite side is AR coated. The system includes a milling machine for thinning the opposite side, a laser arrangement for directing heat via the opposite side to a portion of the circuitry, and a microscope for monitoring the circuitry and detecting therein a circuit that reacts to the heat.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
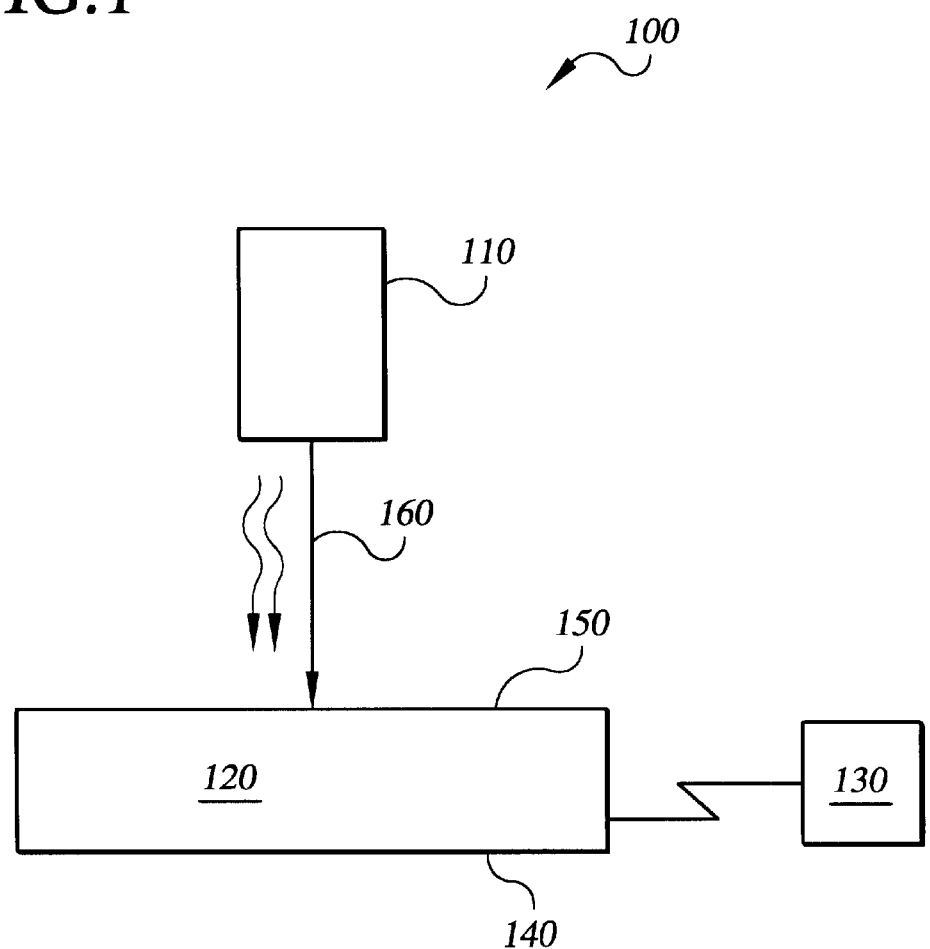
FIG. 1 shows a system for testing a semiconductor device, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for devices requiring or benefiting from analysis of temperature-sensitive defects. While the present invention is not necessarily limited to such devices, various aspects of the invention may be appreciated through a discussion of examples using this context.

FIG. 1 illustrates a first example embodiment in which a system 100 for testing a semiconductor die 120 that has a circuit side 140 and a back side 150, with the back side 150 thinned to no more than about 100 microns. A first heat source 110 is used to direct heat 160 at a portion of the backside 150 of the semiconductor die 120. The semiconductor die 120 is powered, and a circuit monitor 130 is coupled to the semiconductor die 120 for monitoring the circuitry and for detecting therein a circuit that reacts to the heat.

For instance, heat source 110 may include a laser, such as a near-infrared laser having a wavelength of about 1–2.5 microns. A laser such as 321IR (1064 nm Nd: YAG) available from Zeiss, Inc. may be modified to provide sufficient power in this regard. The Zeiss 321 IR is a near IR scanning microscope; using this type of device, the monitor 130 is implemented along with the heat source 110 as part of one unit.

Figure 2:
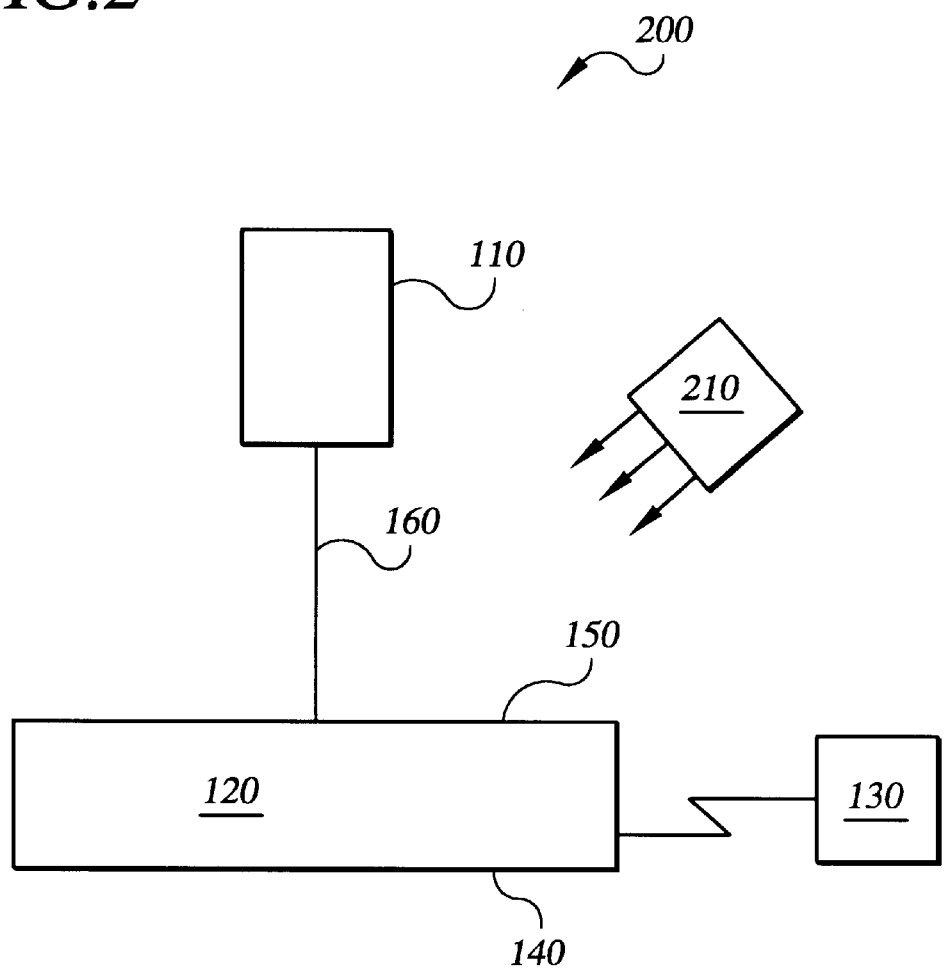
FIG. 2 shows another system for testing a semiconductor device, according to another example embodiment of the present invention.

FIG. 2 illustrates another example embodiment, in which a system 200 is adapted for testing a semiconductor die 120. Similar to the system shown in FIG. 1, the system 200 further includes a second heat source 210 that is used to conventionally heat the semiconductor die 120 prior to heating with the first heat source 110. Heat source 210 may include, for instance, devices using heating methods such as convection, conduction or radiation, or a combination thereof. Such devices may include items such as a peltier device, heat tape, and heat elements.

An example method for testing a semiconductor die, according to another aspect of the present invention, is directed to a semiconductor die that has circuitry on one side and silicon on an opposite side, wherein the opposite side is coated with anti-reflective material ("AR" coated") to minimize the reflected light when laser-heating. First, the opposite side is thinned. The die is then powered via a power supply, and heat is directed via the opposite side to a portion of the circuitry. The circuitry is monitored, and a circuit in the semiconductor die that reacts to the heat is monitored for specific reactions such as intermittent opens/shorts in conductors and between conductors due to, for example, expansions in the metal or surrounding materials.

Thinning the semiconductor die may be accomplished in various manners, and to various degrees. For instance, the device may be thinned using conventional processes such as FIB (focused-ion beam) milling, lapping, polishing, laser-chemical etching, and using tools such as Chip UnZip®, available from Hyper Vision, Inc. In an example implementation, the semiconductor die is thinned to less than about 100 microns. In another example implementation, a target area of the semiconductor die is further thinned by locally thinning to about 8 microns. It has been discovered that the transmission of laser power improves as more material is removed from the die. As the transmission of power improves, less power is necessary to achieve desired results. In one implementation, a laser having a wavelength of between about 400 and 600 nanometers is used to locally thin the die.

Heating the semiconductor die may be accomplished, for example, with a laser beam having a wavelength of about 1–2.5 microns focused on a portion of the circuitry within the semiconductor die. It has been discovered that temperature increases of about 50° C.–200° C. are achievable with about 100–200 MW of power focused on areas in diameter of about 1–5 microns. It has further been discovered that heating with a laser having a wavelength of about 1.3 microns produces improved heating over lasers having other wavelengths. The portion of the circuitry focused upon may include, for instance, a specific node within the circuitry. Heat from the laser beam may, for example, be absorbed by a portion of the circuitry that reacts. In one implementation, the reaction to the heat includes a circuit that recovers from a failure. In another implementation, the reaction to the heat includes a circuit that fails. In another implementation, the reactions can be due to causing a short and causing an open; each of these can be considered a circuit failure or circuit recovery, depending upon the application.

Monitoring the circuit may include monitoring parameters such as voltage shifts, Iddq shifts, and Pattern Pass/Fail.

In another example embodiment, heating the semiconductor die further includes conventionally heating the die, using methods such as convection, conduction, and radiation, prior to heating with a laser beam. For instance, the die can be conventionally heated to a temperature just below the threshold for detecting a reaction therein. A portion of the circuitry may then be heated with a laser beam, thereby causing that portion of the circuitry to exceed the temperature threshold necessary to cause a reaction.

Figure 3:
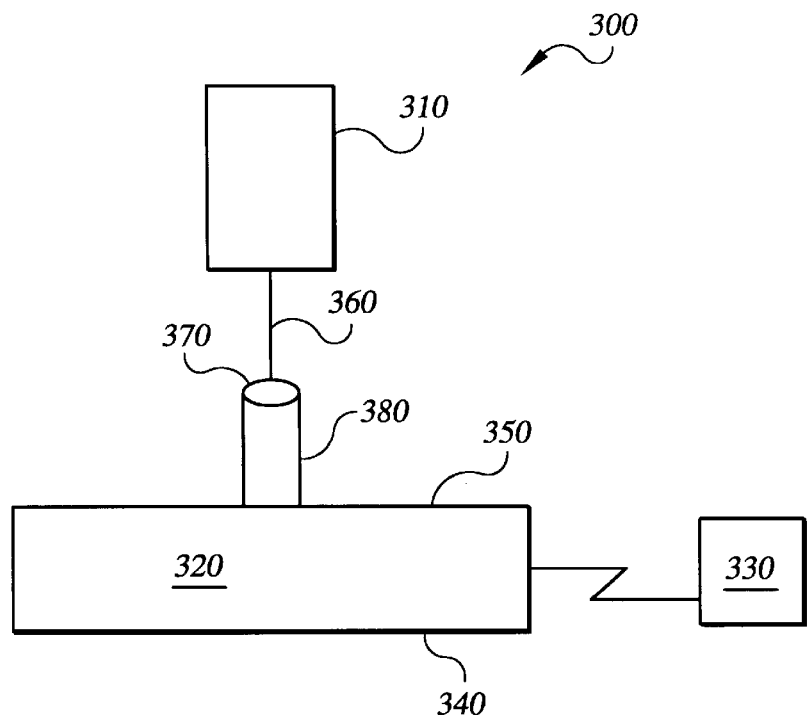
FIG. 3 shows another system for testing a semiconductor device, according to another example embodiment of the present invention.
Figure 4:
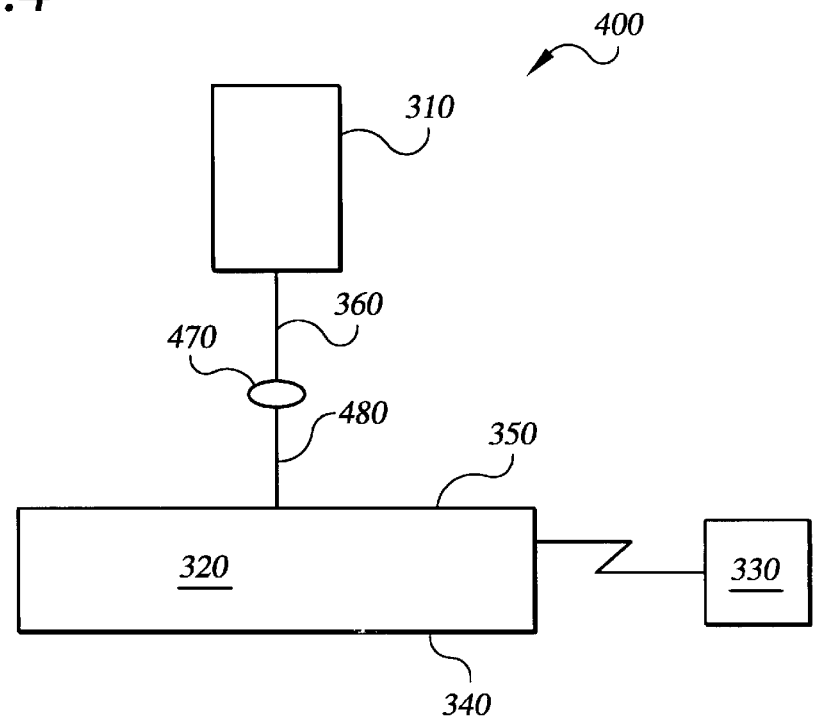
FIG. 4 shows another system for testing a semiconductor device, according to yet another example embodiment of the present invention.

FIGS. 3 and 4 show a system for isolating a defect within the circuitry in a semiconductor die 320 having a circuit side 340 and a backside 350, wherein the backside 350 is AR coated, according to another example embodiment of the present invention. In one example application, the backside 350 of the semiconductor die 320 is thinned to no more than about 100 microns. A laser 310 is used to direct a beam 360 at the backside 350 of the semiconductor die 320. The laser 310 may be included as part of a near-infrared laser scanning confocal microscope, such as the Zeiss 321IR. A circuit monitor 330 is coupled to monitor the circuit within the die. An objective 370 is placed between the laser 310 and the die 320. Initially, the objective is used to expand the beam. A circuit that reacts to the laser beam is detected by the circuit monitor 330. The objective 370 is then changed to objective 470, and the laser beam is re-focused as a smaller beam 480. The circuit monitor 330 again detects a circuit that reacts. This process can be repeated, thereby more narrowly-isolating the defect.

According to another example embodiment, a defect can be isolated using a laser having a spot mode. Yet another example embodiment includes using a raster scan. These embodiments may be used in conjunction with other methods for isolating defects described herein. For instance, after the general area within a semiconductor die in which a defect exists has (or defects have) been located, a "spot" mode, vector mode or a raster scan mode may be used to further isolate the defect(s) within the general area.

Figure 5:
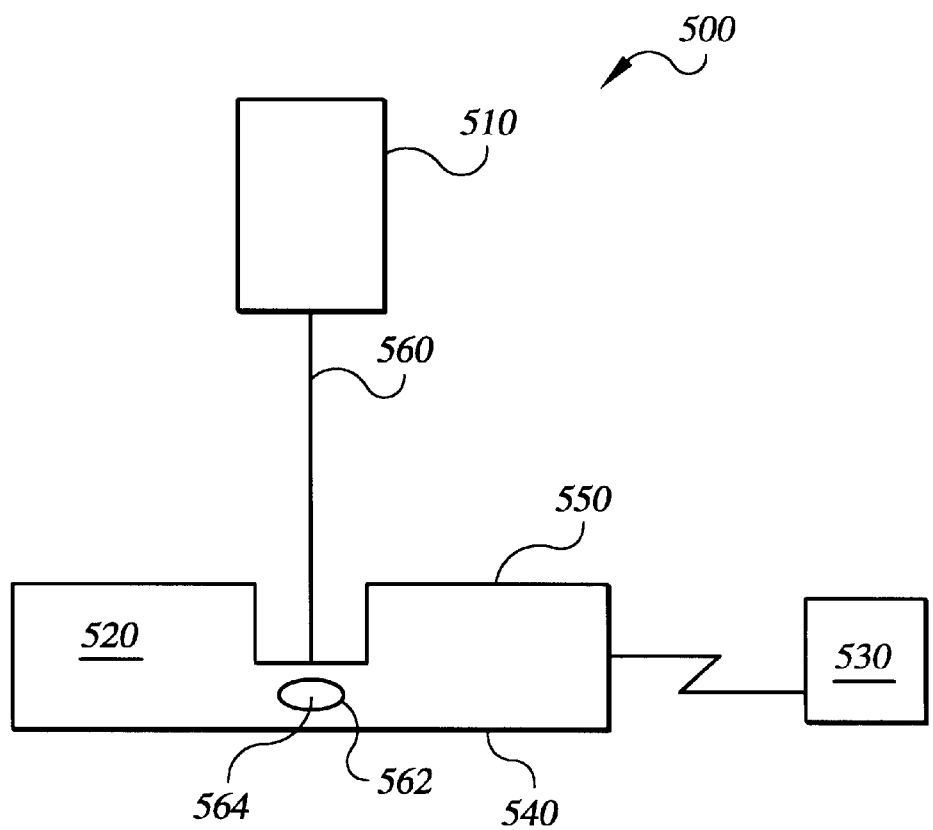
FIG. 5 shows another system for testing a semiconductor device, according to still another example embodiment of the present invention.

FIG. 5 shows a system for isolating a defect within circuitry in a semiconductor die 520 having a circuit side 540 and a backside 550, according to another example embodiment of the present invention. The backside 550 of the semiconductor die 520 is locally thinned as shown to no more than about 8 microns. A laser or a FIB etcher, 510 is used to direct a beam 560 at the locally thinned area of the semiconductor die 520. A circuit monitor 530 is coupled to the semiconductor die 520 for monitoring anode 562 in the circuitry (564) and detecting therein a circuit that reacts. The laser 510 can include a high-powered visible laser, such as an Argon Ion Laser emitting in the visible spectrum (e.g., 488 um and 515 nmd). The beam 560 heats the circuitry within the semiconductor die 520, the heat at the surface propagates into the die, and the circuit monitor 530 detects a circuit therein that reacts.

In one embodiment, the laser 510 is for both laser-etching for local thinning and also for local-heating.

While the present invention has been described with reference to several particular example embodiments, those skilled in the art will recognize that many changes may be made thereto without departing from the spirit and scope of the present invention, which is set forth in the following claims.

What is claimed is:

1. A method for testing a semiconductor die having circuitry on one side and silicon on an opposite side, the method comprising:
   thinning the opposite side;
   while operating the die, directing heat, via the thinned opposite side, toward a portion of the circuitry; and
   monitoring signal outputs from the circuitry and detecting therefrom a circuit that reacts to the heat.

2. A method for testing a semiconductor device, according to claim 1, wherein thinning includes at least one of: lapping, laser-chemical etching, and polishing.

3. A method for testing a semiconductor device, according to claim 1, wherein thinning includes reducing the thickness of the silicon to less than about 100 microns.

4. A method for testing a semiconductor device, according to claim 1, wherein thinning includes locally reducing the thickness of the silicon to less than about 8 microns.

5. A method for testing, according to claim 4, wherein locally reducing includes using a visible laser-generating light, having a wave length in a range between 400 and 600 nm, and therewith heating the silicon.

6. A method for testing a semiconductor device, according to claim 1, wherein directing heat includes focusing a laser beam at portions of the circuitry.

7. A method for testing a semiconductor device, according to claim 6, wherein focusing the laser beam at portions of the circuitry includes raster scanning.

8. A method for testing a semiconductor device, according to claim 7, wherein heat from the laser beam is absorbed by the circuit that reacts to the heat.

9. A method for testing a semiconductor device, according to claim 7, wherein focusing the laser beam includes applying about 100–200 mW of laser power focused at about 1–5 micron diameter spots.

10. A method for testing a semiconductor device, according to claim 7, wherein the laser beam is directed toward a target node in the circuit.

11. A method for testing a semiconductor device, according to claim 7, wherein the laser beam is focused on a smaller area in response to detecting a reaction in the device.

12. A method for testing a semiconductor device, according to claim 11, wherein the laser beam is re-focused in a smaller area in response to detecting a reaction in the device.

13. A method for testing a semiconductor device, according to claim 6, wherein focusing the laser beam at portions of the circuitry includes using a spot mode.

14. A method for testing a semiconductor device, according to claim 7, wherein the laser beam wavelength is between about 1 micron to 2.5 microns.

15. A method for testing a semiconductor device, according to claim 1, wherein the circuit recovers from a failure.

16. A method for testing a semiconductor device, according to claim 1, wherein the circuit fails.

17. A method for testing a semiconductor device, according to claim 1, further comprising heating at least a portion of the semiconductor device.

18. A method for testing a semiconductor device, according to claim 17, wherein heating occurs before the step of directing heat.

19. A method for testing a semiconductor die, according to claim 18, wherein the operation of the die does not include providing power to the die using a constant-current source.

20. A method for testing a semiconductor device, according to claim 17, wherein heating includes heating by at least one of: radiation, convection or conduction.

21. A method for testing a semiconductor device, according to claim 17, wherein heating includes heating the die to a temperature just below the threshold temperature needed to cause a predetermined reaction.

22. A method for testing a semiconductor die, according to claim 21, wherein the operation of the die does not include providing power to the die using a constant-current source.

23. A method for testing a semiconductor die, according to claim 1, wherein the signal outputs include at least one of: voltage shifts, Iddq shifts and pattern pass/fail criteria.

24. A method for testing a semiconductor die, according to claim 23, wherein the operation of the die does not include providing power to the die using a constant-current source.

25. A method for testing a semiconductor die, according to claim 1, wherein the operation of the die does not include providing power to the die using a constant-current source.

* * * * *